(12) United States Patent
Kawakami et al.

(10) Patent No.: US 7,041,523 B2
(45) Date of Patent: *May 9, 2006

(54) METHOD OF FABRICATING NITRIDE SEMICONDUCTOR DEVICE

(75) Inventors: Toshiyuki Kawakami, Tenri (JP); Yukio Yamasaki, Daitou (JP); Shigetoshi Ito, Ikoma (JP); Susumu Omi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 110 days.

This patent is subject to a terminal disclaimer.

(21) Appl. No.: 10/815,847

(22) Filed: Apr. 2, 2004

(65) Prior Publication Data

US 2004/0191942 A1    Sep. 30, 2004

Related U.S. Application Data

(62) Division of application No. 10/188,369, filed on Jul. 3, 2002, now Pat. No. 6,737,678.

(30) Foreign Application Priority Data

Jul. 3, 2001    (JP) ............................. 2001-202496

(51) Int. Cl.
*H01L 21/00*    (2006.01)

(52) U.S. Cl. ........................... 438/33; 438/42; 438/46; 438/460

(58) Field of Classification Search ................... 438/33, 438/42, 46, 460
See application file for complete search history.

(56) References Cited

U.S. PATENT DOCUMENTS

| 5,373,173 | A | 12/1994 | Ohata et al. |
| 6,278,173 | B1 | 8/2001 | Kobayashi et al. |
| 6,335,559 | B1 * | 1/2002 | Charles ..................... 257/620 |
| 6,865,201 | B1 * | 3/2005 | Ito et al. .................. 372/45.01 |
| 6,888,867 | B1 * | 5/2005 | Sawaki et al. ........... 372/46.01 |

FOREIGN PATENT DOCUMENTS

| JP | 11-004048 | 1/1999 |
| JP | 11-251265 | 9/1999 |

* cited by examiner

*Primary Examiner*—Maria F. Guerrero
(74) *Attorney, Agent, or Firm*—Morrison & Foerster LLP

(57) ABSTRACT

In a wafer having an LD structure 251 formed on a GaN-based substrate 250, cleavage guide grooves 252 are formed in its surface by scribing from above the LD structure 251 with a diamond needle. The cleavage guide grooves 252 are formed one along each of stripe-shaped waveguides 253 formed parallel to the <1-100> direction of the wafer, and are formed in the shape of broken lines in the <11-20> direction of the wafer.

19 Claims, 9 Drawing Sheets

US 7,041,523 B2

METHOD OF FABRICATING NITRIDE SEMICONDUCTOR DEVICE

REFERENCE TO THE RELATED APPLICATION

This application is a division of Ser. No. 10/188,369, filed Jul. 3, 2002, now U.S. Pat. No. 6,737,678.

BACKGROUND OF THE INVENTION

1. Field of the Invention

The present invention relates to a nitride semiconductor device for use in a laser diode or light-emitting diode that emits blue light and to a method of fabricating such a nitride semiconductor device. More particularly, the present invention relates to a nitride semiconductor device having a nitride semiconductor substrate and to a method of fabricating such a nitride semiconductor device.

2. Description of the Prior Art

Expectations have been running high for and various applications have been attempted with III–V nitride semiconductors composed of a group III element such as Al, Ga, or In and a group V element N (hereinafter such a semiconductor will be referred to as a "GaN-based semiconductor") as light-emitting devices and power devices for their desirable band structure and chemical stability. For example, many attempts have been made to lay a layer of a GaN-based semiconductor on a sapphire substrate to produce a nitride semiconductor device that emits blue laser. In general, in AlGaInAs- or AlGaInP-based nitride semiconductor devices, cavities, which are essential for laser oscillation, are produced by the use of cleavage planes.

However, in a case where a GaN-based semiconductor layer is laid on a sapphire substrate, since sapphire does not cleave easily, the end surfaces of the produced chip have surface irregularities as large as 4 to 10 nm on average, making it difficult to obtain a satisfactory cavity. Furthermore, in a case where a nitride semiconductor device is formed by laying a GaN-based semiconductor layer on a sapphire substrate, since, in general, the angle at which sapphire cleaves is 30° apart from the angle at which the GaN-based semiconductor layer laid on the substrate cleaves, it is difficult to reduce the surface irregularities on the end surfaces irrespective of along which of the substrate's and the upper layer's cleavage planes the chip is diced apart.

For these reasons, much attention has been paid to using, as a substrate on which to lay a GaN-based semiconductor layer, a GaN-based substrate that cleaves easily and that cleaves in the same direction as the GaN-based semiconductor layer laid on its surface and producing the end surfaces by cleavage. Here, a GaN-based substrate denotes a substrate formed out of a GaN-based semiconductor. When a GaN-based substrate is used, the GaN-based semiconductor layer and the GaN-based substrate cleave in the same direction, and therefore the end surfaces are expected to be flat. Moreover, when a GaN-based substrate is used, good lattice matching is achieved between the GaN-based substrate and the GaN-based semiconductor layer laid on it, and no difference exists between their thermal expansion coefficients. This helps reduce the strain on and hence defects of the nitride semiconductor device, and is thus expected to extend the useful life of the nitride semiconductor device.

An example of a nitride semiconductor device in which, as described above, a GaN-based semiconductor layer is laid on a GaN-based substrate and then the end surfaces of the cavity are produced by cleavage is disclosed, for example, in Japanese Patent Application Laid-Open No. H11-4048.

However, concerning the abovementioned example of a nitride semiconductor device using a GaN-based substrate disclosed in Japanese Patent Application Laid-Open No. H11-4048, there is given no detailed description about how the end surfaces of the cavity are produced or how the chip is diced apart. This has led the inventors of the present invention to try in various ways how a wafer using a GaN-based substrate cleaves, only to find that, in practice, it is difficult to dice such a wafer with a constant, uniform cavity length and at a satisfactory yield rate.

For example, in the dicing process of a wafer 130, as shown in FIG. 13, having stripe-shaped optical waveguides 131 and having cleavage guide grooves 132 formed at an edge so as to run in the direction of cleavage, ideally, cavities are produced as a result of the wafer 130 being cleaved along cleaving lines, like the one designated as 133, running in the same direction as the cleavage guide grooves 132. Cleaving along such cleaving lines 133 permits the stripe-shaped optical waveguides 131 to be split with flat surfaces. This makes it possible to produce nitride semiconductor devices at a high yield rate. In reality, however, many dicing lines meander, like the one designated as 134, or run at 60°, like the one designated as 135, relative to the desired dicing direction.

One cause of the formation of such unintended dicing lines as those designated as 134 and 135 is that, even when cleavage guide grooves 132 are formed in the <11-21> direction (of which a description will be given later) in which cleavage occurs, in a GaN-based substrate, which has a hexagonal crystal structure, directions that are at 60° relative to that direction are equally valid cleavage directions, and therefore cleavage occurs as easily also along lines that are at 60° relative to the desired dicing direction. If such unintended cleavage occurs only once, a dicing line like the one designated as 135 in FIG. 13 results; if such unintended cleavage occurs continuously, a dicing line like the one designated as 134 results. Another cause is that, compared with a sapphire substrate, a GaN-based substrate is so brittle as to make cleavage in inclined directions as described above more likely, causing, in the worst case, the devices to be broken to pieces.

SUMMARY OF THE INVENTION

An object of the present invention is to provide a nitride semiconductor device that is diced apart with flat surfaces at the ends of the cavity. Another object of the present invention is to provide a method of fabricating a nitride semiconductor device which permits dicing to be achieved in a fixed direction all the time.

To achieve the above objects, according to one aspect of the present invention, a nitride semiconductor device is provided with:

a substrate that exhibits cleavage;

a nitride semiconductor layer including a cleavage plane equal to a cleavage plane of the substrate and formed out of a compound containing a group III element and nitrogen;

a stripe-shaped optical waveguide formed in the nitride semiconductor layer;

a cavity formed by cleaved end surfaces of the nitride semiconductor layer and the stripe-shaped optical waveguide; and a cleavage guide groove formed, to help form the end surfaces, in the top surface of the nitride semiconductor layer from above elsewhere than right above the stripe-shaped optical waveguide.

According to another aspect of the present invention, a method of fabricating a nitride semiconductor device as described above includes the steps of:

adjusting to within the range from 80 to 160 μm the thickness of a nitride semiconductor wafer formed by depositing on a substrate that exhibits cleavage a nitride semiconductor layer formed out of a compound containing a group III element and nitrogen and including a cleavage plane equal to a cleavage plane of the substrate, with a plurality of stripe-shaped optical waveguides formed at equal intervals in the nitride semiconductor layer;

forming a plurality of cleavage guide grooves in the shape of discontinuous broken lines in the top surface of the nitride semiconductor wafer by scribing from above the nitride semiconductor layer in such a way that the cleavage guide grooves reach the substrate; and cleaving the nitride semiconductor wafer along the cleavage guide grooves.

Here, the cleavage guide grooves are formed elsewhere than right above the stripe-shaped optical waveguides.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
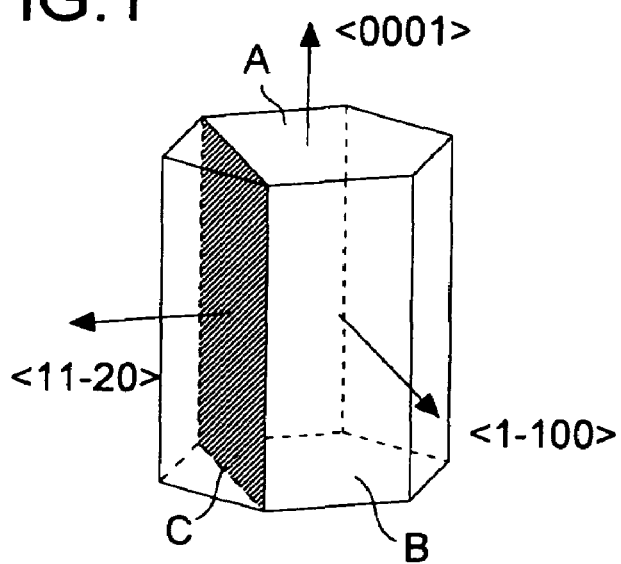
FIG. 1 is a diagram illustrating the hexagonal crystal structure.

Hereinafter, embodiments of the present invention will be described with reference to the drawings. First, the definitions of some terms used in the present specification will be given.

In the present specification, a "GaN-based semiconductor" denotes a III–V nitride compound semiconductor that is composed of a group III element such as Al, Ga, or In and a group V element N and that has a hexagonal crystal structure. Examples of GaN-based semiconductors include compounds whose composition is expressed as $Al_XGa_YIn_{1-X-Y}N$ (where $0 \leq X \leq 1$, $0 \leq Y \leq 1$, and $0 \leq X+Y \leq 1$), compounds obtained by substituting another element for part (about 20% or less) of the group III element contained in those compounds, and compounds obtained by substituting another element for part (about 20% or less) of the group V element contained in the first-mentioned compounds.

In the present specification, a "GaN-based substrate" denotes, like a GaN-based semiconductor, a substrate formed mainly out of a III–V nitride compound semiconductor that is composed of a group III element such as Al, Ga, or In and a group V element N and that has a hexagonal crystal structure. Examples of GaN-based substrates include substrates whose composition is expressed as $Al_XGa_YIn_{1-X-Y}N$ (where $0 \leq X \leq 1$, $0 \leq Y \leq 1$, and $0 \leq X+Y \leq 1$), substrates obtained by substituting another element for part (about 20% or less) of the group III element contained in those substrates, and substrates obtained by substituting another element for part (about 20% or less) of the group V element contained in the first-mentioned substrates. In addition, consider a case where a thick layer of a GaN-based semiconductor is deposited on a dissimilar substrate formed mainly out of a substance other than a GaN-based semiconductor, then an LD structure, described later, is laid further on top to produce a wafer, and eventually the dissimilar substrate is removed before the wafer is diced in any of the embodiments described hereinafter. In a case like this, the thick GaN-based semiconductor layer is to be understood to belong to the category of GaN-based substrates defined in the present specification.

In the present specification, an "LD structure" denotes a structure formed mainly out of a GaN-based semiconductor so as to include light-emitting portions and waveguide structures before being formed into cavities. An LD structure is a layer structure deposited, or epitaxially grown, on the GaN-based substrate described above, excluding metal used as electrodes and insulating film or the like inserted between such electrodes and the GaN-based semiconductor. An LD structure may contain a GaN-based semiconductor having a partially different crystal structure or a material other than a GaN-based semiconductor.

In the present specification, a "stripe-shaped optical waveguide" denotes an integral structure, including a light-emitting portion, for confining and guiding the light emitted from the light-emitting portion.

In the present specification, an "average surface irregularity value Ra" denotes the average value of a surface roughness curve with respect to its center line as measured with a surface roughness tester.

In the present specification, an "RMS value," or simply "surface irregularity average," denotes the magnitude of surface irregularities as obtained by measuring a surface roughness curve over a length of 4 μm parallel to the growth layer surface with an AFM (automatic force microscope) and calculating its RMS (root mean square, the square root of the sum of the squares of deviations of the surface roughness curve from its center line).

In the present specification, a "groove depth" denotes the value obtained by measuring the depth of a cleavage guide groove or cleavage assist groove vertically from its rim to its bottom with a GaN-based semiconductor laser device placed so that the interface between its GaN-based substrate and LD structure is horizontal. A groove depth may be of one of the following three types depending on where the rim is considered to be located: (1) a groove depth with respect to the surface of the GaN-based semiconductor laid as the LD structure; (2) a groove depth with respect to the center line of the interface between the GaN-based substrate and the LD structure, and (3) a groove depth with respect to the bottom surface of the GaN-based substrate.

Moreover, it is assumed that, in a hexagonal crystal structure as shown in FIG. 1, <0001> represents all the directions of normals to surfaces identified as "A," specifically [0001] and [000-1]; <1-100> represents all the directions of normals to surfaces identified as "B," specifically [1-100], [10-10], [01-10], [-1100], [-1010], and [0-110]; and <11-20> represents all the directions of normals to surfaces identified as "C," specifically [11-20], [1-210], [-2110], [-1-120], [-12-10], and [2-1-10].

In the following descriptions of the embodiments, GaN-based semiconductor laser devices are taken up as representatives of nitride semiconductor devices.

First Embodiment

Figure 2:
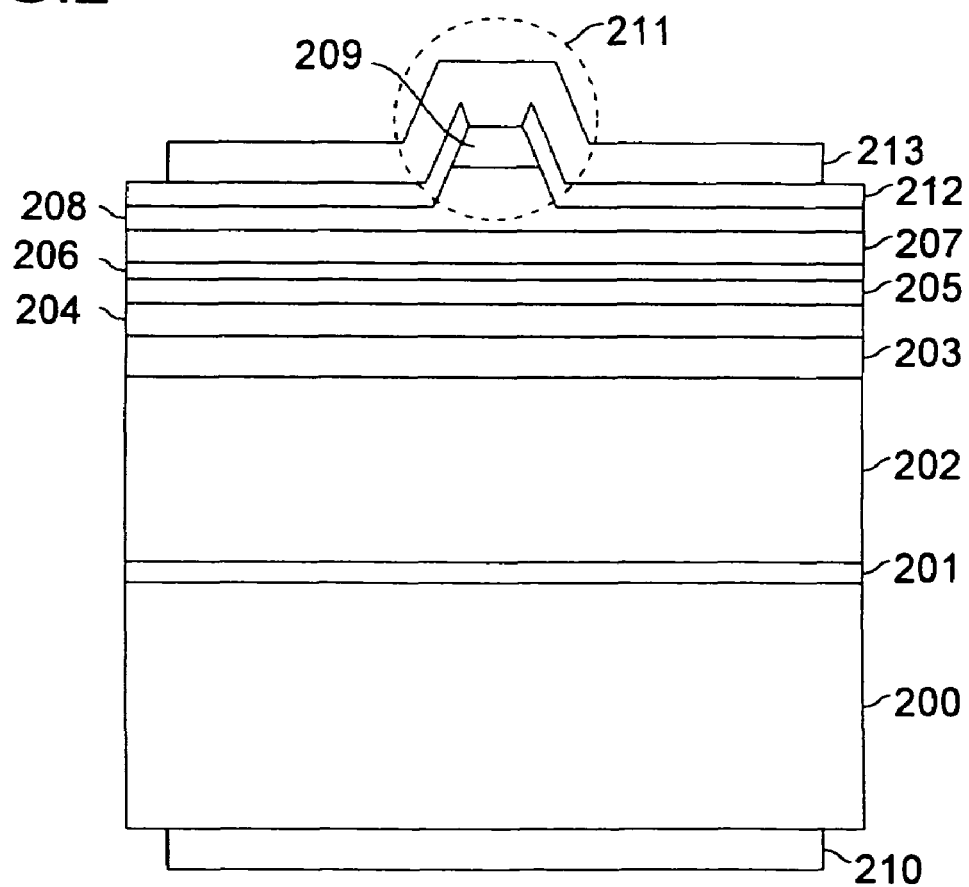
FIG. 2 is a sectional view showing the structure of the wafer before the GaN-based semiconductor laser device of a first embodiment of the invention is diced apart.
Figure 3A:
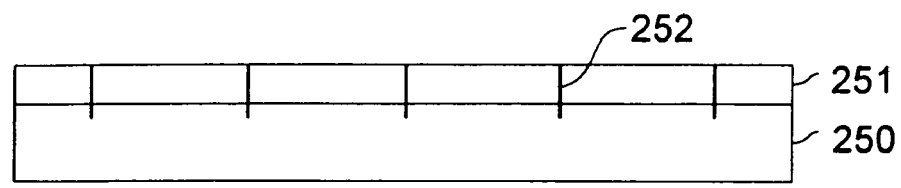
FIG. 3A is a sectional view illustrating the dicing of the wafer in the first embodiment.
Figure 3B:
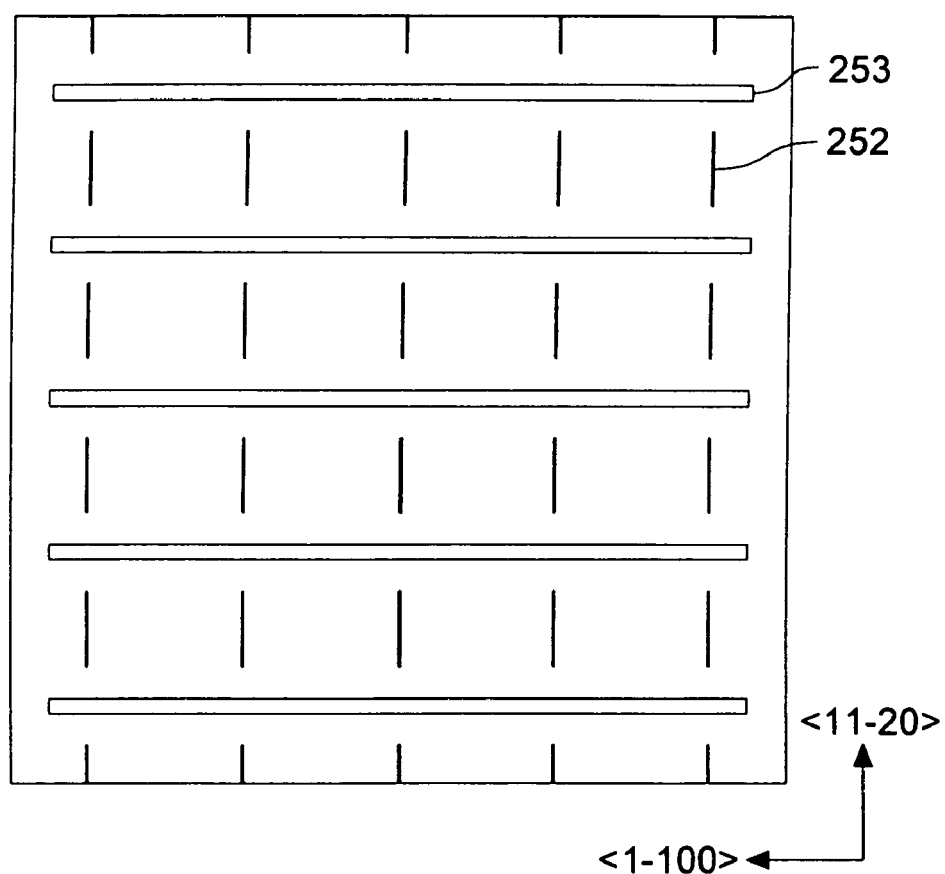
FIG. 3B is a top view illustrating the dicing of the wafer in the first embodiment.
Figure 4:
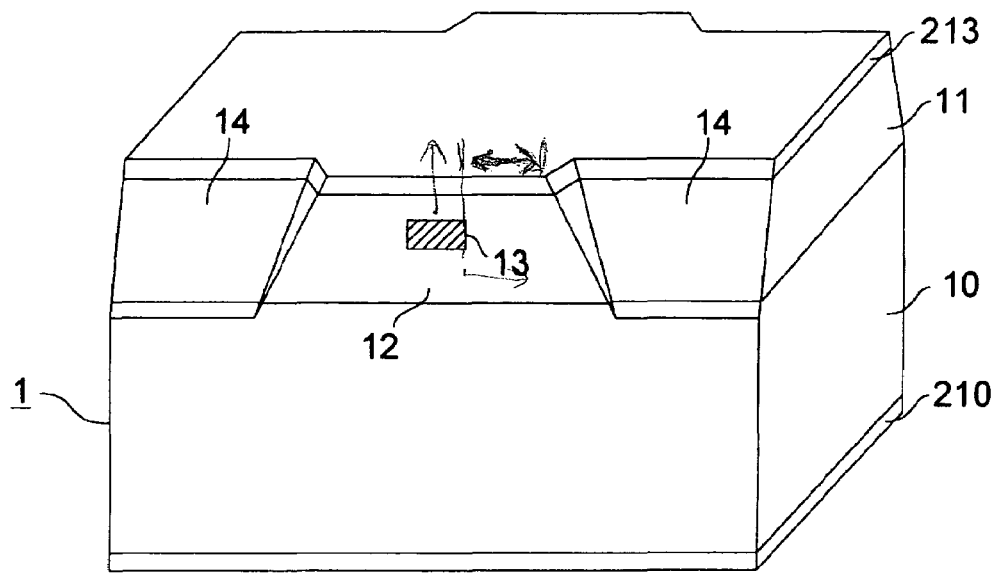
FIG. 4 is an external perspective view of the GaN-based semiconductor laser device of the first embodiment.

A first embodiment of the invention will be described below with reference to the drawings. FIG. 2 is a sectional view showing the structure of the wafer before the GaN-based semiconductor laser device of this embodiment is diced apart. FIGS. 3A and 3B are a sectional view and a top view, respectively, illustrating the dicing of the wafer. FIG. 4 is an external perspective view of the GaN-based semiconductor laser device diced apart.

1. Fabrication Processes of the GaN-Based Semiconductor Laser Device (Forming the Wafer)

First, how the wafer is formed will be described with reference to FIG. 2.

An n-GaN-based substrate 200 having a crystal growth surface on the (0001) plane and having a film thickness of 100 to 500 μm is cleaned organically. In this embodiment, the film thickness of the n-GaN-based substrate 200 is adjusted to 135 μm.

The cleaned n-GaN-based substrate is then transported into MOCVD (metal organic chemical vapor deposition) equipment, and is subjected, in an atmosphere of hydrogen ($H_2$), to cleaning at a high temperature of about 1,100° C. Thereafter, the temperature is lowered, and then, along with a flow of $H_2$ as a carrier gas flowing at a flow rate of 10 l/min, silane ($SiH_4$) is introduced at 10 nmol/min, and then, at 600° C., ammonia ($NH_3$) and trimethylgallium (TMG) are introduced at 5 l/min and 20 mol/min, respectively, to grow an n-GaN-based buffer layer 201 having a thickness of 10 nm to 10 μm (for example, 100 nm).

This buffer layer 201 may be a GaN buffer layer formed with $SiH_4$ introduced at 0 mol/min, or a GaN buffer layer containing Al or In. To make the buffer layer contain Al or In, an adequate amount of trimethylaluminum (TMA) or trimethylindium (TMI), respectively, is introduced during film formation. The buffer layer 201 is a layer formed for the purpose of alleviating the surface distortion of and improving (flattening) the surface morphology and irregularities of the n-GaN-based substrate, and therefore may be omitted if, in the n-GaN-based substrate, the n-GaN for crystal growth has superb crystallinity.

Next, with a flow of nitrogen ($N_2$) and ammonia ($NH_3$) at 5 l/min each, the temperature is raised up to about 1,050° C. Thereafter, the carrier gas is switched from $N_2$ to $H_2$, and TMG and $SiH_4$ are introduced at 100 μmol/min and 10 nmol/min, respectively, to grow an n-GaN contact layer 202 having a thickness of 0.1 to 10 μm (for example, 4 μm).

Next, the flow rate of TMG is adjusted to 50 μmol/min, and a prescribed amount of TMA is introduced to lay a layer of n-$Al_{x1}Ga_{1-x1}N$ (where, for example, x1=0.2) and thereby form an n-AlGaN clad layer 203 having a total film thickness of, for example, 0.8 μm. This n-AlGaN clad layer 203 may be replaced with a film of another material as long as the material has a low refractive index and a large band gap compared with the n-GaN optical guide layer 204 described later. It is also possible to combine a number of layers to make them as a whole have an average refractive index and an average band gap that fulfill the conditions stated just above in comparison with the n-GaN optical guide layer 204.

After the formation of the n-AlGaN clad layer 203, the supply of TMA is stopped, and the flow rate of TMG is adjusted to 100 μmol/min to grow the n-GaN optical guide layer 204 until it has a thickness of 50 to 200 nm (for example, 100 nm). Thereafter, the supply of TMG is stopped, the carrier gas is switched from $H_2$ to $N_2$, and the temperature is lowered down to 700° C. Then, TMI is introduced in a prescribed amount and TMG at 15 μmol/min to grow a barrier layer of $In_vGa_{1-v}N$ (where 0<v<1). A predetermined period thereafter, the supply of TMI is increased to a prescribed amount to grow a well layer of $In_wGa_{1-w}N$ (where 0<w<1).

This variation in the amount of TMI supplied is repeated to form an InGaN multiple quantum well active layer 205 having an alternating layer structure composed of InGaN barrier layers and InGaN well layers. The compositions and film thicknesses of the InGaN with which the barrier and well layers are formed are so designed that the light emitted has a wavelength in the range from 370 to 430 nm, and the flow rate of TMI introduced during growth is so adjusted as to obtain films having the designed In compositions.

The InGaN multiple quantum well active layer 205 has, preferably, 2 to 6 well layers and, particularly preferably, 3 well layers. On completion of the formation of the InGaN multiple quantum well active layer 205, the supply of TMI and TMG is stopped, and the temperature is raised back up to 1,050° C. Then, the carrier gas is switched again from $N_2$ to $H_2$, and then, with a flow of TMG at 50 μmol/min, TMA in an adequate amount, and bis(cyclopentadienyl)magnesium ($Cp_2Mg$), which is a p-type doping material, at 10 nmol/min, an evaporation prevention layer 206 of p-$Al_zGa_{1-z}N$ (0≦z≦0.3) having a thickness of 0 to 20 nm is grown. On completion of the growth of this p-AlGaN evaporation prevention layer 206, the supply of TMA is stopped, and the amount of TMG supplied is adjusted to 100 μmol/min to grow a p-GaN optical guide layer 207 having a thickness of 50 to 200 nm (for example, 100 nm).

Next, the flow rate of TMG is adjusted to 50 μmol/min, and a prescribed amount of TMA is introduced to lay a p-type $Al_{x2}Ga_{1-x2}N$ layer (where, for example, x2=0.2) and thereby form a p-AlGaN clad layer 208 having a total film thickness of, for example, 0.8 μm. This p-AlGaN clad layer 208 may be replaced with a film of another material as long as the material has a low refractive index and a large band gap compared with the p-GaN optical guide layer 207. It is also possible to combine a number of layers to make them as a whole have an average refractive index and an average band gap that fulfill the conditions stated just above in comparison with the p-GaN optical guide layer 207.

Lastly, the amount of TMG supplied is adjusted to 100 μmol/min, and the supply of TMA is stopped to grow a p-GaN contact layer 209 having a film thickness of 0.01 to 10 μm (for example, 0.1 μm). With this ends the growth of an LD structure on top of the GaN-based substrate 200. On completion of the growth, the supply of TMG and Cp$_2$Mg is stopped and the temperature is lowered, and then, at room temperature, the wafer is transported out of the MOCVD equipment. With a wafer actually formed in this way, we measured its surface flatness and observed that the average surface irregularity value was Ra=100 Å.

Subsequently, the wafer is subjected to a series of processes to form individual laser devices. First, in the process of forming p-electrodes, etching is performed in the shape of stripes in the <1-100> direction (see FIGS. 3A and 3B) of the GaN-based substrate 200 to form ridged stripes 211. Thereafter, a SiO$_2$ dielectric film 212 is vapor-deposited, then the p-GaN contact layer 209 is exposed, and then Pd, Mo, and Au are vapor-deposited in this order to form p-electrodes 213. The p-electrodes 213 may be formed by vapor-depositing Pd, Pt, and Au in this order, or Pd and Au in this order, or Ni and Au in this order.

Next, by a physical process such as polishing, or by a chemical process such as wet etching or dry etching, the bottom surface of the n-GaN substrate 200 is polished to adjust the thickness of the wafer to 80 to 160 μm. In this way, the thickness of the wafer is adjusted to make the wafer easy to dice. Specifically, a wafer with a thickness smaller than the lower limit of the range makes its handling during device formation difficult; by contrast, a wafer with a thickness greater than the upper limit of the range makes its dicing difficult.

Next, from below the bottom surface of the n-GaN substrate 200, Hf and Al are vapor-deposited in this order to form n-electrodes 210. Using Hf in the n-electrodes 210 in this way is effective in reducing the contact resistance of the n electrodes. The n-electrodes 210 may by formed by vapor-depositing Ti and Al in this order, or Ti and Mo in this order, or Hf and Au in this order, or any other suitable combination of materials.

In the process of forming the n-electrodes 210, instead of forming them from below the bottom surface of the n-GaN substrate 200, they may be formed on the n-GaN layer 202 exposed from above the top surface of the wafer by dry etching.

Dicing the Wafer

Next, how the wafer is diced in this embodiment will be described with reference to FIGS. 3A and 3B. FIGS. 3A and 3B are a sectional view and a top view, respectively, of the wafer having the LD structure formed on top of the GaN-based substrate 200 as described above.

In FIGS. 3A and 3B, to simplify the explanations, it is assumed that the GaN-based substrate 250 includes the n-GaN-based substrate 200, n-GaN buffer layer 201, and n-electrodes 210, and that the LD structure 251 includes the n-GaN contact layer 202, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, SiO$_2$ dielectric film 212, and p-electrodes 213.

In the wafer having the LD structure 251 formed on the GaN-based substrate 250 as described above, stripe-shaped waveguides 253 are formed inside the LD structure 251 as shown in FIG. 3B. The stripe-shaped waveguides 253 are formed parallel to the <1-100> direction. Between every two adjacent ones of the stripe-shaped waveguides 253, cleavage guide grooves 252 are formed to help cleave the wafer into a plurality of bars in the direction of <11-20>. The wafer has, where the cleavage guide grooves 252 are formed, a section as shown in FIG. 3A.

The cleavage guide grooves 252 are formed, by scribing using a diamond needle, in the top surface of the LD structure 251 between every two adjacent ones of the stripe-shaped waveguides 253 as shown in FIG. 3B. Here, the depth d from the top surface of the LD structure 251 to the deepest end of the cleavage guide grooves 252 is so controlled as to be at least within the range 1 μm≦d≦10 μm. This helps improve the "bar yield rate," i.e., the rate at which bars are obtained without defective breakage when the wafer is cleaved into bars.

In a case where the LD structure 251 is thin enough to permit the cleavage guide grooves 252 to reach the interface between the GaN-based substrate 250 and LD structure 251, the depth d1 from the interface between the GaN-based substrate 250 and LD structure 251 to the deepest end of the cleavage guide grooves 252 may be so controlled as to be in the range 1 μm≦d1≦10 μm. This helps improve the "device yield rate," i.e., the rate at which the individual devices obtained from the bars cleaved apart are such that the end surfaces of the laser cavity are so flat as to have an RMS value of 0.5 nm or less and that variations in the cavity length are within a prescribed range.

This is because it is thereby possible to prevent degradation of the far-field pattern (FFP) of the emitted light and lowering of the reflectivity on the end surfaces of the cavity due to unwanted surface irregularities resulting from the LD structure 251 partially containing a substance that does not cleave or a substance that cleaves in a different direction and thereby permits the dicing pressure to scatter around.

As described above, the cleavage guide grooves 252 run in the <11-20> direction of the GaN-based substrate 250. By making the cleavage guide grooves 252 start and end at points 50 μm or more away from the stripe-shaped waveguides 253, it is possible to cleave the wafer with an increased bar yield rate. Further preferably, the start and end points of the cleavage guide grooves 252 are located 100 μm or more away from the stripe-shaped waveguides 253 to achieve an increased device yield rate.

In this embodiment, as shown in FIG. 3A, the depth from the interface between the GaN-based substrate 250 and the LD structure 251 to the deepest end of the cleavage guide grooves 252 is uniformly 1 μm. On the other hand, the distance from the stripe-shaped waveguides 253 to the start or end points of the cleavage guide grooves 252 is 125 μm.

For a maximum bar yield rate in the dicing of the wafer, each stroke of the cleavage guide grooves 252 is formed, preferably, in the shape of a solid line as long as possible in the <11-20> direction within the region described above, but may be formed in the shape of a broken line. The cleavage guide grooves 252 may be formed, instead of by scribing as described above, by dry etching such as RIE (reactive ion etching) or wet etching.

Moreover, the cleavage guide grooves 252 may be formed, instead of between every two adjacent ones of the stripe-shaped waveguides 253 as shown in FIG. 3B, so that the interval between every two adjacent ones of the cleavage guide grooves 252 is 1 mm or shorter and simultaneously that the distance from their start and end points to the stripe-shaped waveguides 253 fulfills the condition described above. This eliminates the need to form the cleavage guide grooves 252 between every two adjacent ones of the stripe-shaped waveguides 253.

Next, the wafer, having the cleavage guide grooves 252 formed in this way, is cleaved in the <11-20> direction into bars. The dicing of the wafer here is achieved by pressing a breaking blade onto the bottom surface of the GaN-based substrate 250, in the positions where the cleavage guide grooves 252 are located, from below so as to break the wafer. In this way, in the bars cleaved apart, end surfaces are formed by exploiting cleaved surfaces at which the stripe-shaped waveguides 253 are split. The dicing of the wafer may be achieved by cleaving, i.e., hitting the wafer with a blade so that it is broken by the shock, or by heating the portions around the scribed lines locally, or by breaking using the shock caused by a sound wave or a stream of water or the like.

By cleaving in this way a wafer as shown in FIGS. 3A and 3B, we obtained a large number of bars with a cavity length of 500 µm. The actually measured cavity lengths were within ±5 µm of the design value of 500 µm, and the bar yield rate and the device yield rate were over 92% and 90%, respectively. Moreover, in the bars thus cleaved apart, we measured the average of the surface irregularities on the end surfaces between the cleavage guide grooves 252 and observed that, whereas at distances of 50 µm or shorter from the cleavage guide grooves the RMS value was as great as 10 nm at the maximum, at distances 100 µm or longer from the cleavage guide grooves, the end surfaces were so flat as to show an RMS value of 0.5 nm at the maximum. Considering that the RMS value of the end surfaces formed in a GaN-based semiconductor laid on a sapphire substrate is 3.5 nm on average, the results obtained in this embodiment attest to an improvement in quality in terms of the flatness of the cleaved end surfaces.

The bars thus obtained by cleaving a wafer as shown in FIGS. 3A and 3B are then further cleaved, by performing scribing in their bottom or top surface in the <1-100> direction between every two adjacent stripe-shaped waveguides 253, into individual GaN-based semiconductor laser devices. Here, the scribing may be performed with such a stylus force (the load with which a stylus is pressed onto the wafer) as to press the bars and thereby brake them in the <1-100> direction into GaN-based semiconductor laser devices, or may be performed in such a way as to completely cut the bars into GaN-based semiconductor laser devices.

2. Structure of the GaN-Based Semiconductor Laser Device

With reference to FIG. 4, the structure of the semiconductor laser device 1 formed by being diced apart from a wafer as described above will be described.

In FIG. 4, to simplify the explanations, it is assumed that the GaN-based substrate 10 includes the n-GaN-based substrate 200 and n-GaN buffer layer 201, and that the LD structure 11 includes the n-GaN contact layer 202, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, and $SiO_2$ dielectric film 212.

In the GaN-based semiconductor laser device 1 obtained by dicing a wafer having an LD structure formed on a GaN-based substrate as described above, mirror end surfaces 12 are formed by cleavage on the LD structure 11 formed on the GaN-based substrate 10. Inside the LD structure 11, a stripe-shaped waveguide 13 is provided that serves to guide laser light.

An n-electrode 210 is formed on the bottom surface of the GaN-based substrate 10, and a p-electrode 213 is formed on the top surface of the LD structure 11. To these electrodes, electric power is supplied from outside to operate the GaN-based semiconductor laser device 1. In the four corners in the top surface of the GaN-based semiconductor laser device 1, on its LD structure 11 side, cutaway portions 14 are formed.

The cutaway portions 14 correspond to the cleavage guide grooves 252 (see FIGS. 3A and 3B) that have been formed in the top surface of the wafer beforehand to help produce the mirror end surfaces 12 when the wafer is cleaved into bars. In this embodiment, the depth from the interface between the GaN-based substrate 10 and the LD structure 11 to the deepest end of the cutaway portions 14 is 1 µm. Moreover, when the GaN-based semiconductor laser device 1 is viewed in a two-dimensional projection with the GaN-based substrate 10 down, the cutaway portions 14 are so formed as to start at 125 µm away from the stripe-shaped waveguide 13. In this embodiment, the GaN-based semiconductor laser device 1 has four cutaway portions 14. In practice, however, the number of cutaway portions 14 formed in the GaN-based semiconductor laser device 1 may vary, starting from at least one, depending on how the cleavage guide grooves 252 are formed in the top surface of the wafer beforehand.

In this embodiment, when the wafer is diced to form the GaN-based semiconductor laser device, the cutaway portions that are formed as remnants of the cleavage guide grooves may be cut off altogether. This has the advantage of removing the dust or the like produced when the cleavage guide grooves are formed.

Second Embodiment

Figure 5:
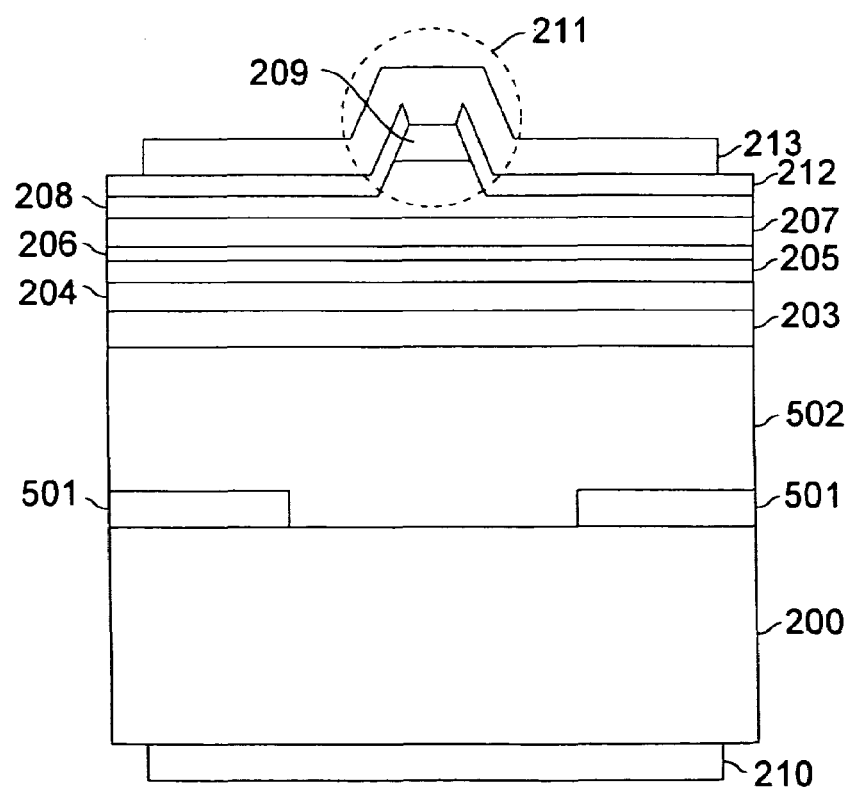
FIG. 5 is a sectional view showing the structure of the wafer before the GaN-based semiconductor laser device of a second embodiment of the invention is diced apart.
Figure 6A:
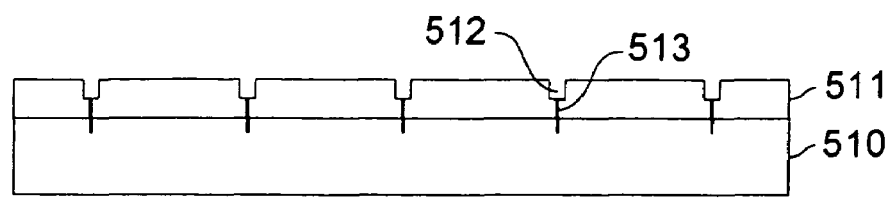
FIG. 6A is a sectional view illustrating the dicing of the wafer in the second embodiment.
Figure 6B:
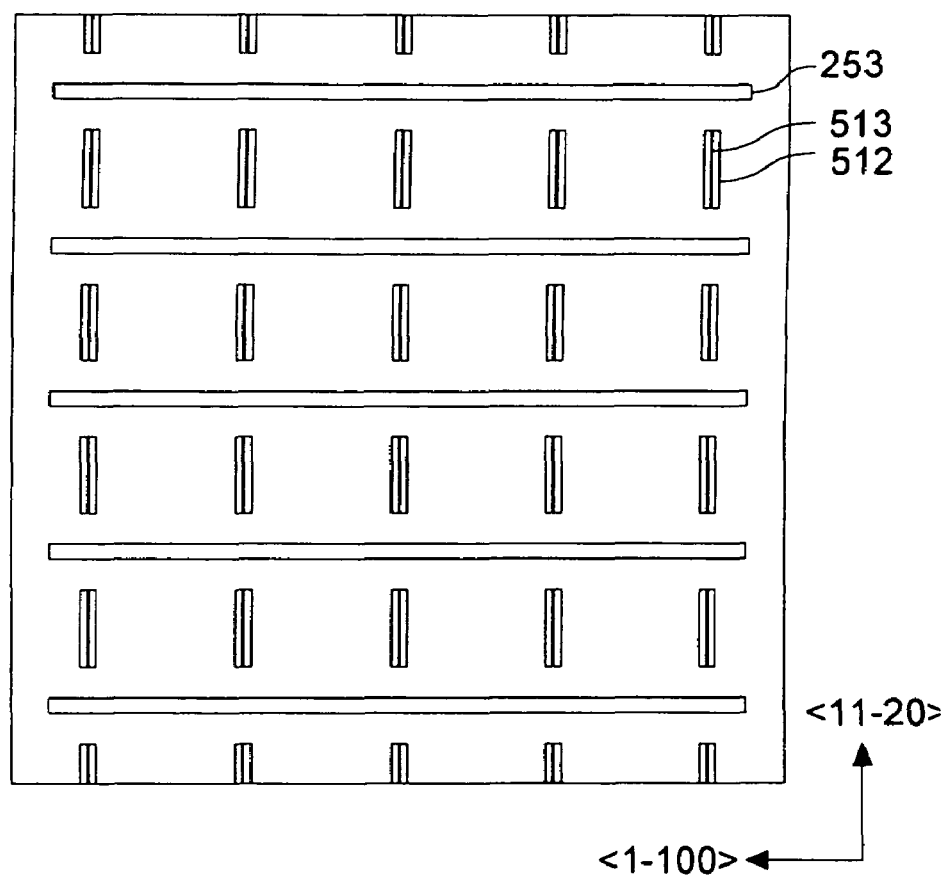
FIG. 6B is a top view illustrating the dicing of the wafer in the second embodiment.
Figure 7:
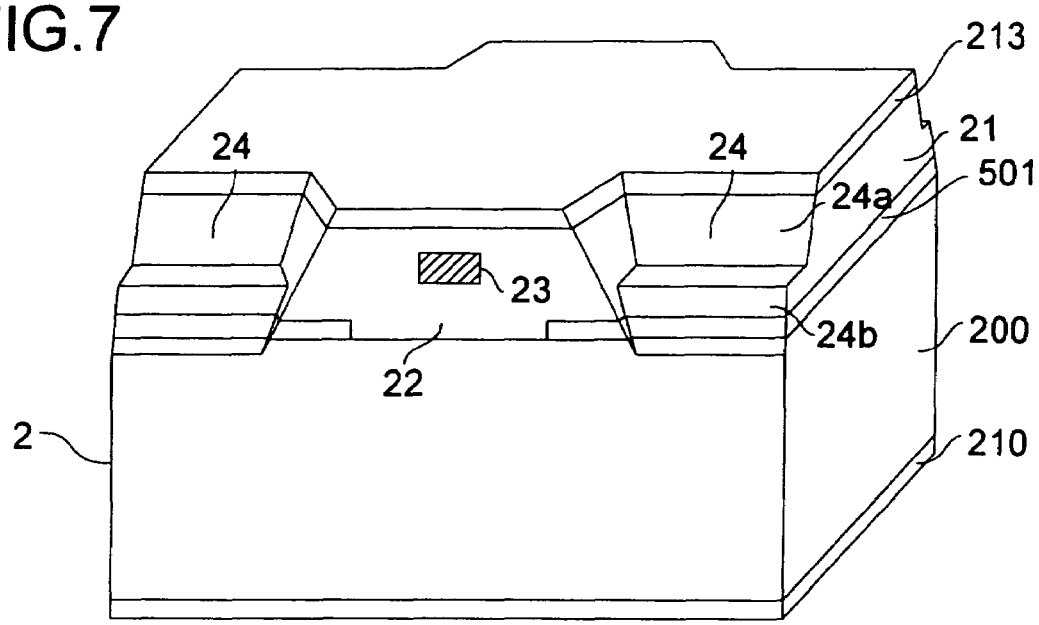
FIG. 7 is an external perspective view of the GaN-based semiconductor laser device of the second embodiment.

A second embodiment of the invention will be described below with reference to the drawings. FIG. 5 is a sectional view showing the structure of the wafer before the GaN-based semiconductor laser device of this embodiment is diced apart. FIGS. 6A and 6B are a sectional view and a top view, respectively, illustrating the dicing of the wafer. FIG. 7 is an external perspective view of the GaN-based semiconductor laser device diced apart.

1. Fabrication Processes of the GaN-Based Semiconductor Laser Device (Forming the Wafer)

First, how the wafer is formed will be described with reference to FIG. 5. In FIG. 5, such elements as are found also in the wafer shown in FIG. 2 are identified with the same reference numerals, and their detailed descriptions will not be repeated.

In this embodiment, unlike the first embodiment (FIG. 2), first, on the top surface of an n-GaN-based substrate 200 having a crystal growth surface on the (0001) plane and having a film thickness of 100 to 500 µm, $SiO_2$ is vapor-deposited by a process using an electron beam or by sputtering to form a growth suppression film. Thereafter, by the use of a lithography technique using a photo-curing resin, stripe-shaped $SiO_2$ masks 501 are formed, from the growth suppression film formed on the n-GaN-based substrate 200, along the <1-100> direction of the n-GaN-based substrate 200.

The masks 501 have a mask width of 13 μm each and are arranged with 7 μm wide windows secured between them. The growth suppression film may be formed out of any other material than $SiO_2$, for example, $SiN_x$, $Al_2O_3$, or $TiO_2$. The masks may be hollow cavities.

The n-GaN-based substrate 200 having the masks 501 formed on its top surface in this way is then cleaned organically, and is then transported into MOCVD equipment, where, along with a flow of $H_2$ as a carrier gas, TMG is introduced at 100 μmol/min and $SiH_4$ at 10 nmol/min to grow an n-GaN contact layer 502 having a thickness of 25 μm.

After this n-GaN contact layer 502 is formed, as in the first embodiment, TMA is introduced to form an n-AlGaN clad layer 203, and then the supply of TMA is stopped to form an n-GaN optical guide layer 204. Thereafter, the carrier gas is switched from $H_2$ back to $N_2$ and the temperature is lowered down to 700° C., and then TMI and TMG are introduced to form an InGaN multiple quantum well active layer 205 having an alternating layer structure composed of InGaN barrier layers and InGaN well layers.

Then, the supply of TMI and TMG is stopped, the temperature is raised back up to 1,050° C., the carrier gas is switched from $N_2$ back to $H_2$, and then TMG, TMA, and $Cp_2Mg$ are introduced to grow a p-AlGaN evaporation prevention layer 206. Thereafter, the supply of TMA is stopped to grow a p-GaN optical guide layer 207. Furthermore, TMA is introduced again to form a p-AlGaN clad layer 208. Finally, the supply of TMA is stopped to grow an p-GaN contact layer 209. With this ends the growth of an LD structure on top of the n-GaN-based substrate 200.

Then, the supply of TMG and $Cp_2Mg$ is stopped and the temperature is lowered, and then the wafer having the LD structure formed on its top surface is transported out of the MOCVD equipment. The wafer is then subjected to a series of processes to form individual laser devices. First, etching is performed to form ridged stripes 211, then a $SiO_2$ dielectric film 212 is vapor-deposited, then the p-GaN contact layer 209 is exposed, and then Pd, Mo, and Au are vapor-deposited in this order to form p-electrodes 213. As in the first embodiment, the p-electrodes 213 may be formed by vapor-depositing Pd, Pt. and Au in this order, or Pd and Au in this order, or Ni and Au in this order.

Next, by a physical process such as polishing, or by a chemical process such as wet etching or dry etching, the bottom surface of the n-GaN substrate 200 is polished to adjust the thickness of the wafer to 80 to 160 μm. Next, from below the bottom surface of the n-GaN substrate 200, Hf and Al are vapor-deposited in this order to form n-electrodes 210. As in the first embodiment, the n-electrodes 210 may by formed by vapor-depositing Ti and Al in this order, or Ti and Mo in this order, or Hf and Au in this order, or any other suitable combination of materials.

In the process of forming the n-electrodes 210, instead of forming them from below the bottom surface of the n-GaN substrate 200, they may be formed on the n-GaN layer 202 exposed from above the top surface of the epitaxial wafer by dry etching.

Dicing the Wafer

Next, how the wafer is diced in this embodiment will be described with reference to FIGS. 6A and 6B. FIGS. 6A and 6B are a sectional view and a top view, respectively, of the wafer having the LD structure formed on top of the GaN-based substrate 200 as described above.

In FIGS. 6A and 6B, to simplify the explanations, it is assumed that the GaN-based substrate 510 includes the n-GaN-based substrate 200 and n-electrodes 210, and that the LD structure 511 includes the mask 501, n-GaN contact layer 502, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, $SiO_2$ dielectric film 212, and p-electrodes 213.

In the wafer having the LD structure 511 formed on the GaN-based substrate 510 as described above, just as in the first embodiment, stripe-shaped waveguides 253 are formed inside the LD structure 511 as shown in FIG. 6B. Between every two adjacent ones of the stripe-shaped waveguides 253, cleavage assist grooves 512 and cleavage guide grooves 513 are formed to help cleave the wafer into a plurality of bars in the direction of <11-20>. The wafer has, where the cleavage assist grooves 512 and the cleavage guide grooves 513 are formed, a section as shown in FIG. 6A.

First, the cleavage assist grooves 512 are formed in the surface of the LD structure 511 by performing RIE between the stripe-shaped waveguides 253 as shown in FIG. 6B. The cleavage assist grooves 512 are so formed as to have a depth half the thickness of the epitaxial layer of the LD structure 511. That is, the cleavage assist grooves 512 are formed above the masks 501 formed inside the LD structure 511.

After the cleavage assist grooves 512 are formed in this way, the cleavage guide grooves 513 are formed, by scribing using a diamond needle, substantially along the center line of the cleavage assist grooves 512. The cleavage guide grooves 513 are formed so as to reach the masks 501 formed inside the LD structure 511, which has a different cleavage plane from the other part of the LD structure 511. Here, the depth d2 from the top surface of the LD structure 511 to the deepest end of the cleavage guide grooves 513 is so controlled as to fulfill 1 μm≦d2≦10 μm. This helps improve the bar yield rate.

In a case where the LD structure 511 is thin enough to permit the cleavage guide grooves 513 to reach the interface between the GaN-based substrate 510 and LD structure 511, the depth d3 from the interface between the GaN-based substrate 510 and LD structure 511 to the deepest end of the cleavage guide grooves 513 may be so controlled as to be in the range 1 μm≦d3≦10 μm. This helps improve the device yield rate.

This is because it is thereby possible to prevent degradation of the FFP of the emitted light and lowering of the reflectivity on the end surfaces of the cavity due to unwanted surface irregularities resulting from the LD structure 551 partially containing a substance that does not cleave or a substance that cleaves in a different direction and thereby permits the dicing pressure to scatter around, for example the masks 501 in particular.

As described above, the cleavage assist grooves 512 and the cleavage guide grooves 513 run in the <11-20> direction of the GaN-based substrate 510. By making the cleavage assist grooves 512 and the cleavage guide grooves 513 start and end at points 50 μm or more away from the stripe-shaped waveguides 253, it is possible to cleave the wafer with an increased bar yield rate. Further preferably, the start and end points of the cleavage assist grooves 512 and the cleavage guide grooves 513 are located 100 μm or more away from the stripe-shaped waveguides 253 to achieve an increased device yield rate.

In this embodiment, as shown in FIG. 6A, the depth from the interface between the GaN-based substrate 510 and the LD structure 511 to the deepest end of the cleavage guide grooves 513 is uniformly 1 µm. On the other hand, the distance from the stripe-shaped waveguides 253 to the start or end points of the cleavage assist grooves 512 and the cleavage guide grooves 513 is 125 µm.

For a maximum bar yield rate in the dicing of the wafer, each stroke of the cleavage assist grooves 512 and the cleavage guide grooves 513 is formed, preferably, in the shape of a solid line as long as possible in the <11-20> direction within the region described above, but may be formed in the shape of a broken line. The cleavage guide grooves 513 may be formed, instead of by scribing as described above, by dry etching such as REE or wet etching.

Moreover, the cleavage assist grooves 512 and the cleavage guide grooves 513 may be formed, instead of between every two adjacent ones of the stripe-shaped waveguides 253 as shown in FIG. 6B, so that the interval between every two adjacent ones of the cleavage assist grooves 512 and the cleavage guide grooves 513 is 1 mm or shorter and simultaneously that the distance from their start and end points to the stripe-shaped waveguides 253 fulfills the condition described above. This eliminates the need to form the cleavage assist grooves 512 and the cleavage guide grooves 513 between every two adjacent ones of the stripe-shaped waveguides 253.

Next, the wafer, having the cleavage assist grooves 512 and the cleavage guide grooves 513 formed in this way, is cleaved in the <11-20> direction into bars. The dicing of the wafer here is achieved, as in the first embodiment, by pressing a breaking blade onto the bottom surface of the GaN-based substrate 510, in the positions where the cleavage guide grooves 513 are located, from below so as to break the wafer. In this way, in the bars cleaved apart, end surfaces are formed by exploiting cleaved surfaces at which the stripe-shaped waveguides 253 are split. The dicing of the wafer may be achieved by cleaving, i.e., hitting the wafer with a blade so that it is broken by the shock, or by heating the portions around the scribed lines locally, or by breaking using the shock caused by a sound wave or a stream of water or the like.

By cleaving in this way a wafer as shown in FIGS. 6A and 6B, we obtained a large number of bars with a cavity length of 500 µm. The actually measured cavity lengths were within ±5 µm of the design value of 500 µm, and the bar yield rate and the device yield rate were over 92% and 96%, respectively. Moreover, in the bars thus cleaved apart, we measured the average of the surface irregularities on the end surfaces between the cleavage assist grooves 512 and obtained results comparable to those obtained in the first embodiment. This attests to an improvement in quality in terms of the flatness of the cleaved end surfaces compared with a case where a GaN-based semiconductor is laid on a sapphire substrate.

The bars thus obtained by cleaving a wafer as shown in FIGS. 6A and 6B are then, as in the first embodiment, further cleaved, by performing scribing in their bottom or top surface in the <1-100> direction between every two adjacent stripe-shaped waveguides 253, into individual GaN-based semiconductor laser devices. Here, the scribing may be performed with such a stylus force as to press the bars and thereby brake them in the <1-100> direction into GaN-based semiconductor laser devices, or may be performed in such a way as to completely cut the bars into GaN-based semiconductor laser devices.

2. Structure of the GaN-Based Semiconductor Laser Device

With reference to FIG. 7, the structure of the semiconductor laser device 2 formed by being diced apart from a wafer as described above will be described.

In FIG. 7, to simplify the explanations, it is assumed that the LD structure 21 includes the masks 501, n-GaN contact layer 502, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, and SiO$_2$ dielectric film 212.

In the GaN-based semiconductor laser device 2 obtained by dicing a wafer having an LD structure formed on a GaN-based substrate as described above, mirror end surfaces 22 are formed by cleavage on the LD structure 21 formed on the GaN-based substrate 200. Inside the LD structure 21, a stripe-shaped waveguide 23 is provided that serves to guide laser light.

An n-electrode 210 is formed on the bottom surface of the GaN-based substrate 200, and a p-electrode 213 is formed on the top surface of the LD structure 21. To these electrodes, electric power is supplied from outside to operate the GaN-based semiconductor laser device 2. In the four corners in the top surface of the GaN-based semiconductor laser device 2, on its LD structure 21 side, cutaway portions 24 are formed. The cutaway portions 24 are each composed of a portion 24a having a depth reaching about the middle of the LD structure 21 and a portion 24b extending from the bottom surface of the portion 24a and reaching the GaN-based substrate 200.

The cutaway portions 24 correspond to the cleavage assist grooves 512 and the cleavage guide grooves 513 (see FIGS. 6A and 6B) that have been formed in the top surface of the wafer beforehand to help produce the mirror end surfaces 22 when the wafer is cleaved into bars, with the portions 24a corresponding to the cleavage assist grooves 512 and the portions 24b to cleavage guide grooves 513. In this embodiment, the depth from the interface between the GaN-based substrate 200 and the LD structure 21 to the deepest end of the cutaway portions 24 is 1 µm.

Moreover, when the GaN-based semiconductor laser device 2 is viewed in a two-dimensional projection with the GaN-based substrate 200 down, the cutaway portions 24 are so formed as to start at 125 µm away from the stripe-shaped waveguide 23. In this embodiment, the GaN-based semiconductor laser device 2 has four cutaway portions 24. In practice, however, the number of cutaway portions 24 formed in the GaN-based semiconductor laser device 2 may vary, starting from at least one, depending on how the cleavage assist grooves 512 and the cleavage guide grooves 513 are formed in the top surface of the wafer beforehand.

In this embodiment, when the wafer is diced to form the GaN-based semiconductor laser device, the cutaway portions that are formed as remnants of the cleavage guide grooves may be cut off altogether. This has the advantage of removing the dust or the like produced when the cleavage guide grooves are formed.

Third Embodiment

Figure 8:
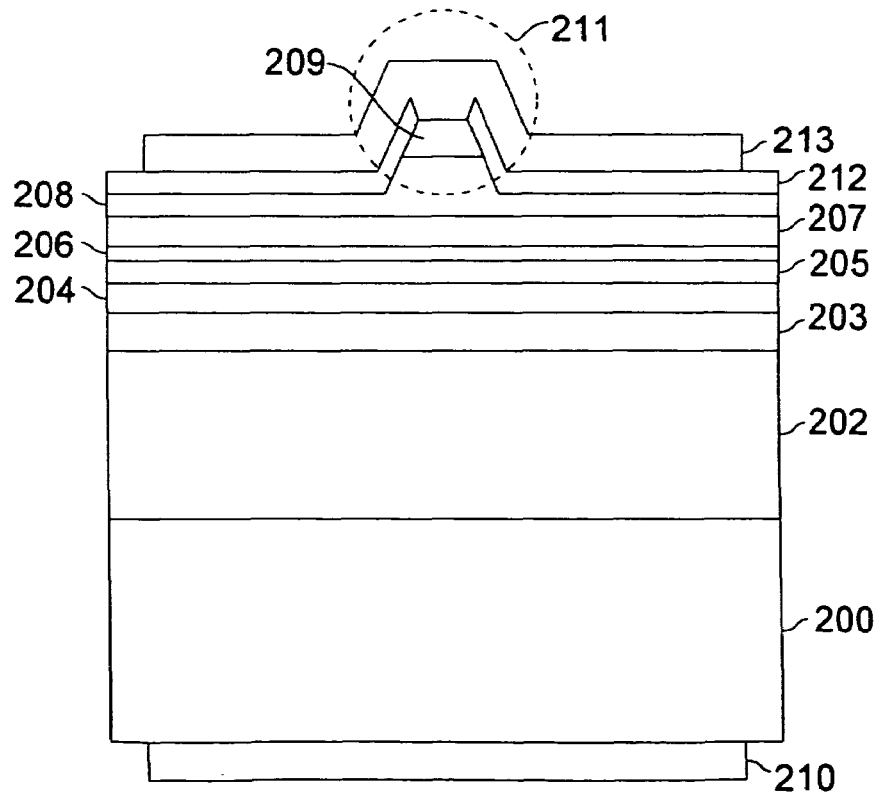
FIG. 8 is a sectional view showing the structure of the wafer before the GaN-based semiconductor laser device of a third embodiment of the invention is diced apart.
Figure 9A:
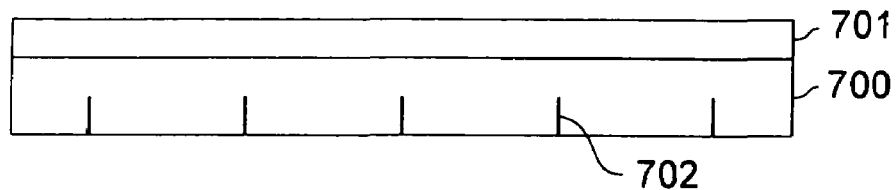
FIG. 9A is a sectional view illustrating the dicing of the wafer in the third embodiment.
Figure 9B:
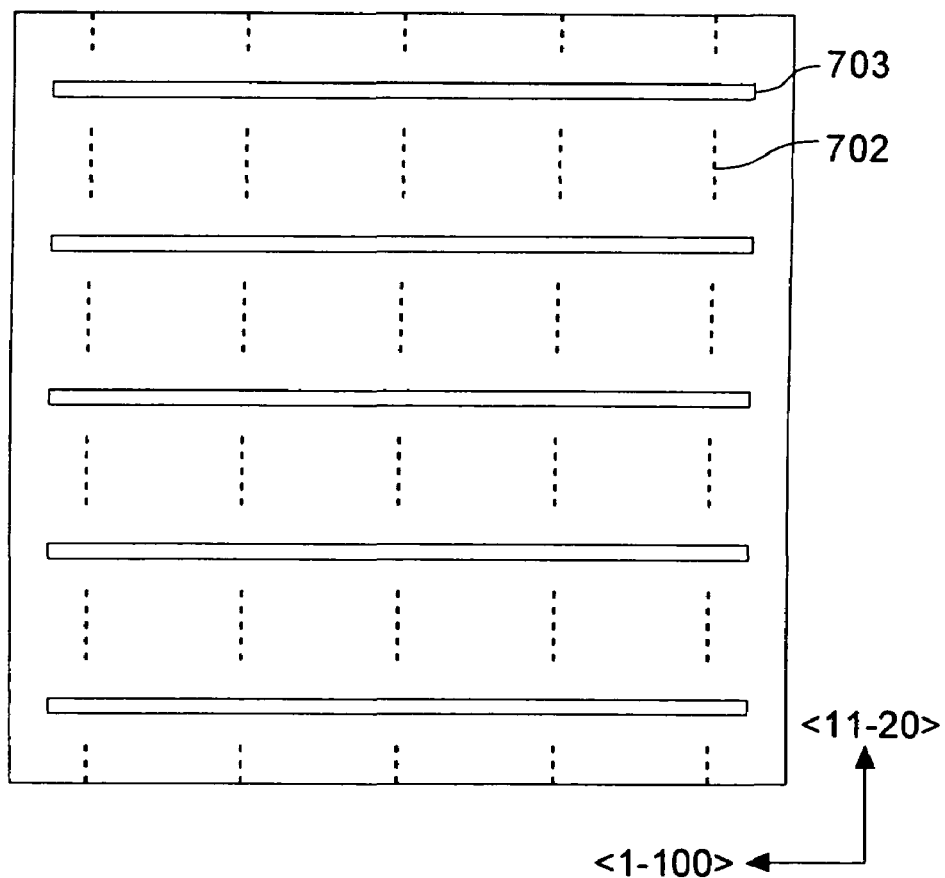
FIG. 9B is a top view illustrating the dicing of the wafer in the third embodiment.

A third embodiment of the invention will be described below with reference to the drawings. FIG. 8 is a sectional view showing the structure of the wafer before the GaN-based semiconductor laser device of this embodiment is diced apart. FIGS. 9A and 9B are a sectional view and a top view, respectively, illustrating the dicing of the wafer. FIG.

10 is an external perspective view of the GaN-based semiconductor laser device diced apart.

1. Fabrication Processes of the GaN-Based Semiconductor Laser Device (Forming the Wafer)

First, how the wafer is formed will be described with reference to FIG. 8. In FIG. 8, such elements as are found also in the wafer shown in FIG. 2 are identified with the same reference numerals, and their detailed descriptions will not be repeated.

In this embodiment, as in the first embodiment (FIG. 2), first, an n-GaN-based substrate 200 having a crystal growth surface on the (0001) plane and having a film thickness of 100 to 500 μm is cleaned organically, and is then transported into MOCVD equipment, where, in an atmosphere of $H_2$, cleaning is performed at a high temperature of about 1,100° C. Then, in this embodiment, unlike the first embodiment, with $N_2$ and $NH_3$ flowing at 5 l/min each, the temperature is lowered down to about 1,050° C., then the carrier gas is switched from $N_2$ to $H_2$, and then TMG and $SiH_4$ are introduced to grow an n-GaN contact layer 202 having a thickness of 0.1 to 10 μm (for example, 4 μm).

Thereafter, an LD structure and n- and p-electrodes are formed in the same manner as in the first and second embodiments. Specifically, on the n-GaN contact layer 202, an n-AlGaN clad layer 203, an N-GaN optical guide layer 204, an InGaN multiple quantum well active layer 205, a p-AlGaN evaporation prevention layer 206, a p-GaN optical guide layer 207, a p-AlGaN clad layer 208, and a p-GaN contact layer 209 are formed in this order to complete the growth of an LD structure. Then, at room temperature, the wafer complete with the LD structure is transported out of the MOCVD equipment.

Then, with this wafer complete with the LD structure, etching is performed on its surface in the shape of stripes to form ridged stripes 211, then, a $SiO_2$ dielectric film 212 is vapor-deposited, and then the p-GaN contact layer 209 is exposed. Further on top, a material for p-electrodes is vapor-deposited to form p-electrodes 213. Moreover, the bottom surface of the n-GaN-based substrate 200 is polished to adjust the thickness of the wafer, and then a material for n-electrodes is vapor-deposited on the bottom surface of the n-GaN substrate to form n-electrodes 210.

Dicing the Wafer

Next, how the wafer is diced in this embodiment will be described with reference to FIGS. 9A and 9B. FIGS. 9A and 9B are a sectional view and a top view, respectively, of the wafer having the LD structure formed on top of the GaN-based substrate 200 as described above.

In FIGS. 9A and 9B, to simplify the explanations, it is assumed that the GaN-based substrate 700 includes the n-GaN-based substrate 200 and n-electrodes 210, and that the LD structure 701 includes the n-GaN contact layer 202, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, $SiO_2$ dielectric film 212, and p-electrodes 213.

In the wafer having the LD structure 701 formed on the GaN-based substrate 700 as described above, just as in the first embodiment, stripe-shaped waveguides 703 are formed inside the LD structure 701 as shown in FIG. 9B. Between every two adjacent ones of the stripe-shaped waveguides 703, cleavage guide grooves 702 are formed to help cleave the wafer into a plurality of bars in the direction of <11-20>.

The wafer has, where the cleavage guide grooves 702 are formed, a section as shown in FIG. 9A.

The cleavage guide grooves 702 are formed, by scribing using a diamond needle, in the bottom surface of the GaN-based substrate 700. Here, the depth d4 from the bottom surface of the GaN-based substrate 700 to the deepest end of the cleavage guide grooves 702 is so controlled as to be at least within the range 1 μm≦d4≦10 μm. As described above, the cleavage guide grooves 702 are formed in the <11-20> direction of the GaN-based substrate 700. Moreover, by making the cleavage guide grooves 702 start and end at 50 μm or more away from the stripe-shaped waveguides 703, it is possible to cleave the wafer with an increased bar yield rate. Further preferably, the start and end points of the cleavage guide grooves 702 are located 100 μm or more away from the stripe-shaped waveguides 703 to achieve an increased device yield rate.

In this embodiment, as shown in FIG. 9A, the depth d4 from the bottom surface of the GaN-based substrate 700 to the deepest end of the cleavage guide grooves 702 is uniformly 4 μm. On the other hand, the distance from the stripe-shaped waveguides 703 to the start or end points of the cleavage guide grooves 702 is 125 μm. For a maximum bar yield rate in the dicing of the wafer, each stroke of the cleavage guide grooves 702 is formed, preferably, in the shape of a solid line as long as possible in the <11-20> direction within the region described above, but may be formed in the shape of a broken line. The cleavage guide grooves 702 may be formed, instead of by scribing as described above, by dry etching such as RIE or wet etching.

Moreover, the cleavage guide grooves 702 may be formed, instead of between every two adjacent ones of the stripe-shaped waveguides 703 as shown in FIG. 9B, so that the interval between every two adjacent ones of the cleavage guide grooves 702 is 1 mm or shorter and simultaneously that the distance from their start and end points to the stripe-shaped waveguides 703 fulfills the condition described above. This eliminates the need to form the cleavage guide grooves 702 between every two adjacent ones of the stripe-shaped waveguides 703.

Next, the wafer, having the cleavage guide grooves 702 formed in this way, is cleaved in the <11-20> direction into bars. In this embodiment, unlike the first embodiment, the dicing of the wafer is achieved by pressing a breaking blade onto the top surface of the LD structure 701, in the positions where the cleavage guide grooves 702 are located, from above so as to break the wafer. In this way, in the bars cleaved apart, end surfaces are formed by exploiting cleaved surfaces at which the stripe-shaped waveguides 703 are split. The dicing of the wafer may be achieved by cleaving, i.e., hitting the wafer with a blade so that it is broken by the shock, or by heating the portions around the scribed lines locally, or by breaking using the shock caused by a sound wave or a stream of water or the like.

By cleaving in this way a wafer as shown in FIGS. 9A and 9B, we obtained a large number of bars with a cavity length of 500 μm. The actually measured cavity lengths were within ±5 μm of the design value of 500 μm, and the bar yield rate was over 92%. Moreover, in the bars thus cleaved apart, we measured the average of the surface irregularities on the end surfaces between the cleavage guide grooves 702 and obtained results comparable to those obtained in the first embodiment. This attests to an improvement in quality in terms of the flatness of the cleaved end surfaces compared with a case where a GaN-based semiconductor is laid on a sapphire substrate.

The bars thus obtained by cleaving a wafer as shown in FIGS. 9A and 9B are then, as in the first embodiment, further cleaved, by performing scribing in their bottom or top surface in the <1-100> direction between every two adjacent stripe-shaped waveguides 703, into individual GaN-based semiconductor laser devices. Here, the scribing may be performed with such a stylus force as to press the bars and thereby brake them in the <1-100> direction into GaN-based semiconductor laser devices, or may be performed in such a way as to completely cut the bars into GaN-based semiconductor laser devices.

2. Structure of the GaN-Based Semiconductor Laser Device

Figure 10:
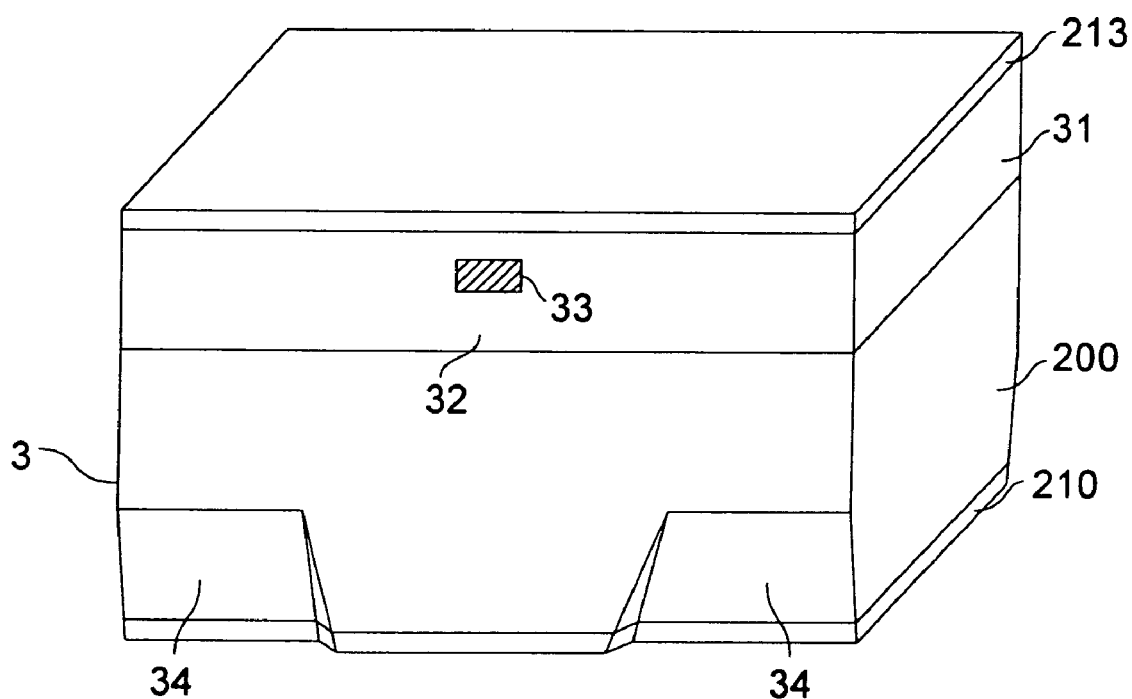
FIG. 10 is an external perspective view of the GaN-based semiconductor laser device of the third embodiment.

With reference to FIG. 10, the structure of the semiconductor laser device 3 formed by being diced apart from a wafer as described above will be described.

In FIG. 10, to simplify the explanations, it is assumed that the LD structure 31 includes the n-GaN contact layer 202, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, and $SiO_2$ dielectric film 212.

In the GaN-based semiconductor laser device 3 obtained by dicing a wafer having an LD structure formed on a GaN-based substrate as described above, mirror end surfaces 32 are formed by cleavage on the LD structure 31 formed on the GaN-based substrate GaN 200. Inside the LD structure 31, a stripe-shaped waveguide 33 is provided that serves to guide laser light.

An n-electrode 210 is formed on the bottom surface of the GaN-based substrate 200, and a p-electrode 213 is formed on the top surface of the LD structure 31. To these electrodes, electric power is supplied from outside to operate the GaN-based semiconductor laser device 3. In the four corners in the bottom surface of the GaN-based semiconductor laser device 3, on its GaN-based substrate 200 side, cutaway portions 34 are formed.

The cutaway portions 34 correspond to the cleavage guide grooves 702 (see FIGS. 9A and 9B) that have been formed in the bottom surface of the wafer beforehand to help produce the mirror end surfaces 32 when the wafer is cleaved into bars. In this embodiment, the depth from the bottom surface of the GaN-based substrate 200 to the deepest end of the cutaway portions 34 fulfills $1\ \mu m \leq d4 \leq 10\ \mu m$.

Moreover, when the GaN-based semiconductor laser device 3 is viewed in a two-dimensional projection with the GaN-based substrate 200 down, the cutaway portions 34 are so formed as to start at 100 μm away from the stripe-shaped waveguide 33. In this embodiment, the GaN-based semiconductor laser device 3 has four cutaway portions 34. In practice, however, the number of cutaway portions 34 formed in the GaN-based semiconductor laser device 3 may vary, starting from at least one, depending on how the cleavage guide grooves 702 are formed in the bottom surface of the wafer beforehand.

In this embodiment, when the wafer is diced to form the GaN-based semiconductor laser device, the cutaway portions that are formed as remnants of the cleavage guide grooves may be cut off altogether. This has the advantage of removing the dust or the like produced when the cleavage guide grooves are formed.

Fourth Embodiment

Figure 11A:
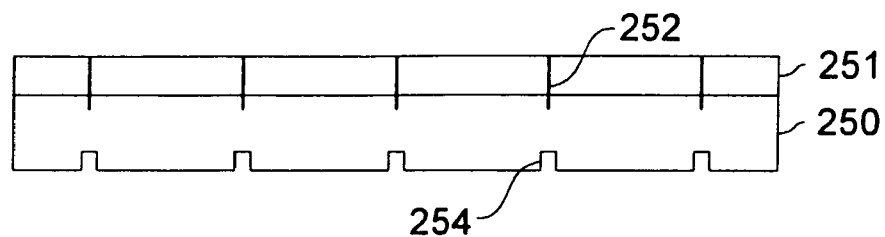
FIG. 11A is a sectional view illustrating the dicing of the wafer in a fourth embodiment of the invention.
Figure 11B:
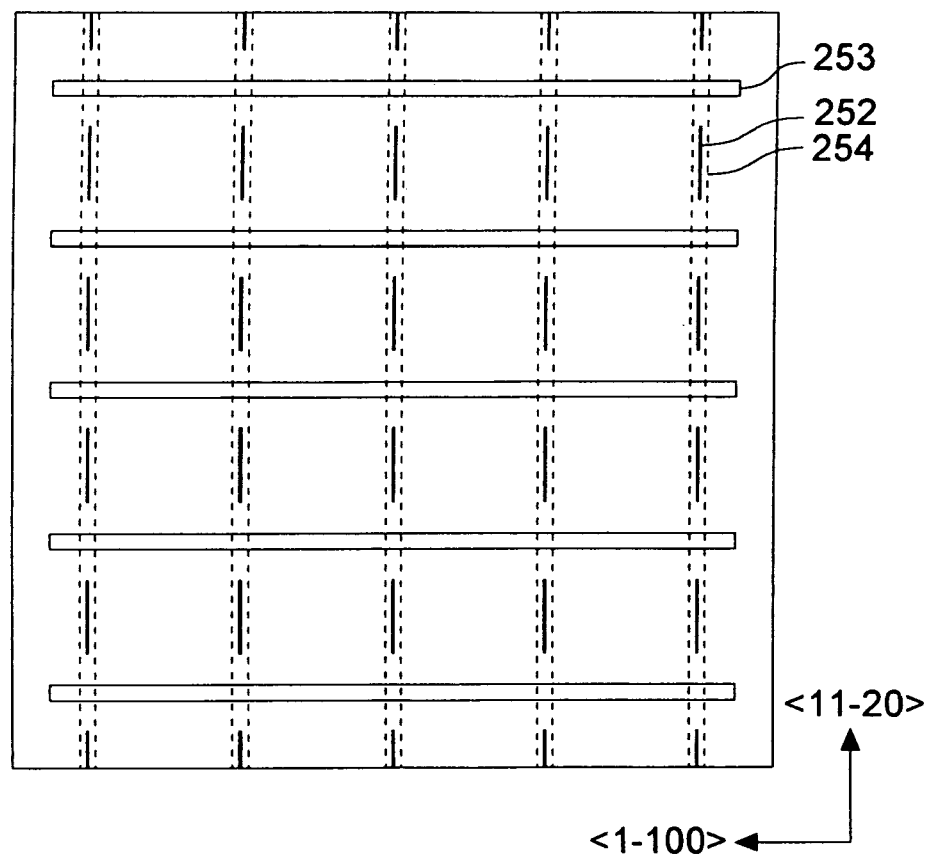
FIG. 11B is a top view illustrating the dicing of the wafer in the fourth embodiment.
Figure 12:
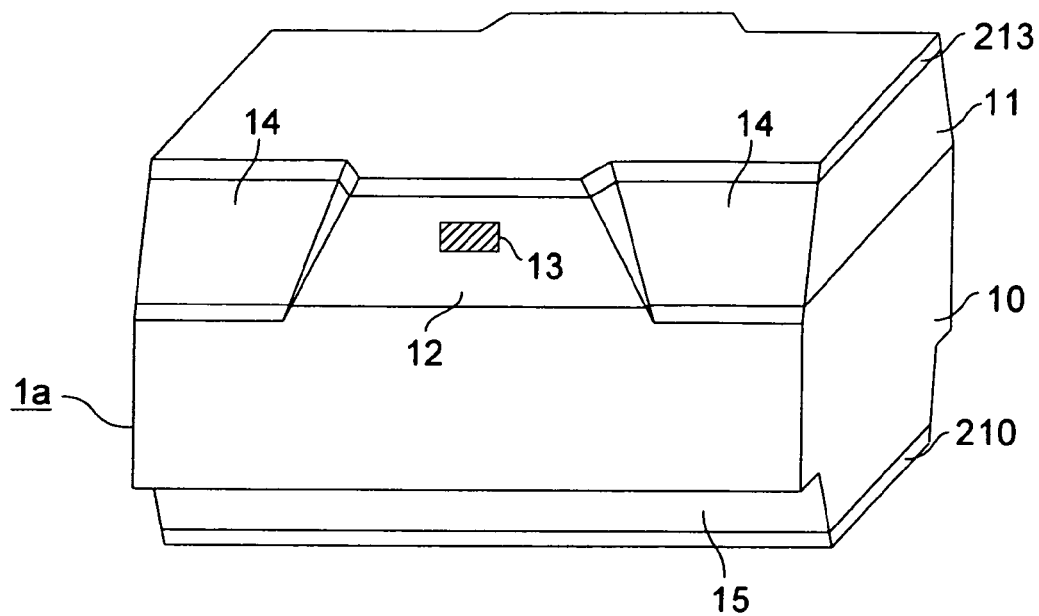
FIG. 12 is an external perspective view of the GaN-based semiconductor laser device of the fourth embodiment.
Figure 13:
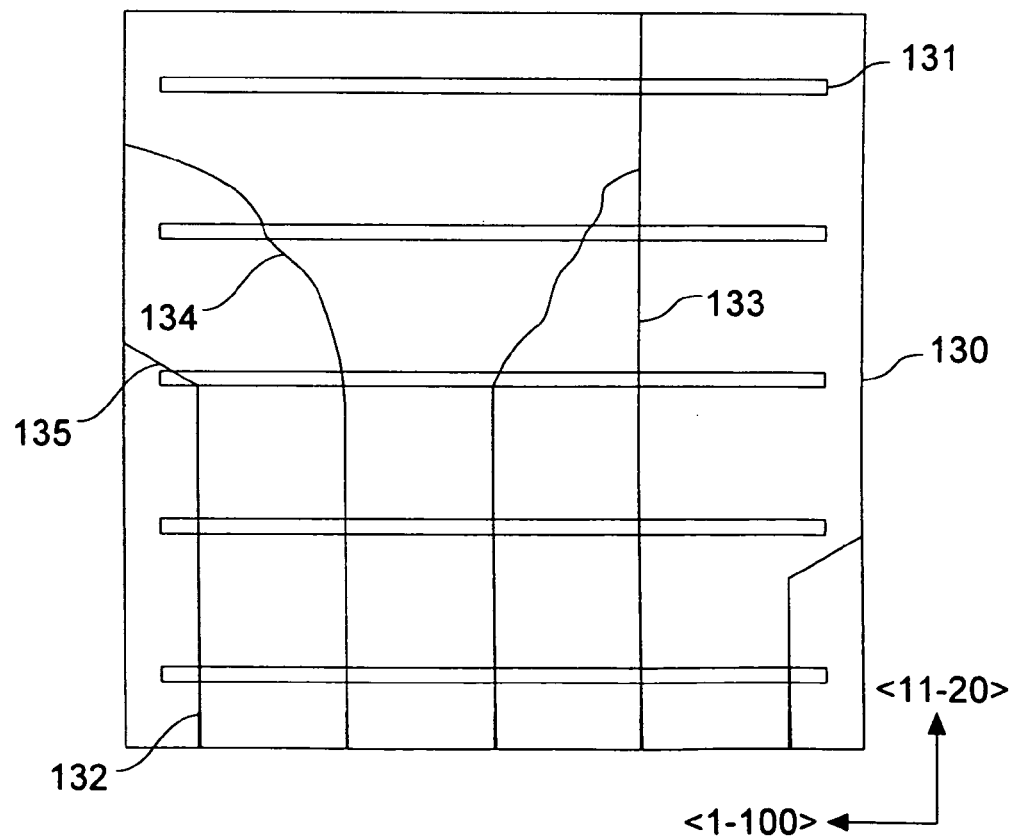
FIG. 13 is a top view illustrating the dicing of a conventional wafer.

A fourth embodiment of the invention will be described below with reference to the drawings. FIGS. 11A and 11B are a sectional view and a top view, respectively, illustrating the dicing of the wafer. FIG. 12 is an external perspective view of the GaN-based semiconductor laser device diced apart.

1. Fabrication Processes of the GaN-Based Semiconductor Laser Device (Forming the Wafer)

Here, the wafer formed in this embodiment is assumed to have the same sectional structure as that formed in the first embodiment and shown in the sectional view in FIG. 2. Therefore, as to how it is formed, the description of the first embodiment is to be consulted, and no detailed explanations will be repeated.

Specifically, on an n-GaN-based substrate 200, an LD structure is formed by growing an n-GaN buffer layer 201, an n-GaN contact layer 202, an n-AlGaN clad layer 203, an n-GaN optical guide layer 204, an InGaN multiple quantum well active layer 205, a p-AlGaN evaporation prevention layer 206, a p-GaN optical guide layer 207, a p-AlGaN clad layer 208, and a p-GaN contact layer 209 in this order. Moreover, on the top surface of the LD structure, ridged stripes 211 are formed, then a $SiO_2$ dielectric film 212 is vapor-deposited, and then the p-GaN contact layer 209 is exposed. Further on top, a material for p-electrodes is vapor-deposited to form p-electrodes 213. In addition, the bottom surface of the n-GaN-based substrate 200 is polished to adjust the thickness of the wafer, and then a material for n-electrodes is vapor-deposited on the bottom surface of the n-GaN-based substrate 200 to form n-electrodes 210.

Dicing the Wafer

Next, how the wafer is diced in this embodiment will be described with reference to FIGS. 11A and 11B. FIGS. 11A and 11B are a sectional view and a top view, respectively, of the wafer having the LD structure formed on top of the GaN-based substrate 200 as described above.

In FIGS. 11A and 11B, as in FIGS. 3A and 3B, to simplify the explanations, it is assumed that the GaN-based substrate 250 includes the n-GaN-based substrate 200, n-GaN buffer layer 201, and n-electrodes 210, and that the LD structure 251 includes the n-GaN contact layer 202, n-AlGaN clad layer 203, n-GaN optical guide layer 204, InGaN multiple quantum well active layer 205, p-AlGaN evaporation prevention layer 206, p-GaN optical guide layer 207, p-AlGaN clad layer 208, p-GaN contact layer 209, $SiO_2$ dielectric film 212, and p-electrodes 213.

Moreover, as in the first embodiment, when the LD structure 251 is formed on the GaN-based substrate 250 to form the wafer, stripe-shaped waveguides 253 are formed inside the LD structure 251 as shown in FIG. 11B.

The wafer formed in this way is placed, with the bottom surface of the GaN-based substrate 250 up, on a dicer provided with a diamond blade, which is a machine for forming grooves in a semiconductor wafer. Then, cleavage assist grooves 254 having a depth d5 (where $0<d5\leq 40\ \mu m$) and a width w ($0<w\leq 30\ \mu m$) are formed in the shape of broken lines in the <11-20> direction as shown in FIG. 11B. Then, the wafer is turned upside down, and, as in the first embodiment, cleavage guide grooves 252 are formed in the shape of solid lines in the top surface of the LD structure 251 as shown in FIG. 11B by scribing with a diamond needle between every two adjacent ones of the stripe-shaped waveguides 253. Thus, whereas the cleavage guide grooves 252 are discontinuous, the cleavage assist grooves 254 are continuous.

Here, when the cleavage guide grooves 252 are formed, the depth d from the top surface of the LD structure 251 to the deepest end of the cleavage guide grooves 252 is so controlled as to be at least within the range 1 µm≦d≦10 µm. This helps improve the bar yield rate. Moreover, by controlling the depth d1 from the interface between the GaN-based substrate 250 and the LD structure 251 to the deepest end of the cleavage guide grooves 252 within the range 1 µm≦d1≦10 µm, it is possible to improve the device yield rate.

As described above, the cleavage guide grooves 252 are formed in the <11-20> direction of the GaN-based substrate 250 and in addition substantially along the center lines of the cleavage assist grooves 254. By making the cleavage guide grooves 252 start and end at points 50 µm or more away from the stripe-shaped waveguides 253, it is possible to cleave the wafer with an increased bar yield rate. Further preferably, the start and end points of the cleavage guide grooves 252 are located 100 µm or more away from the stripe-shaped waveguides 253 to achieve an increased device yield rate.

In this embodiment, as shown in FIG. 11A, the depth from the interface between the GaN-based substrate 250 and the LD structure 251 to the deepest end of the cleavage guide grooves 252 is uniformly 1 µm, and the distance from the stripe-shaped waveguides 253 to the start or end points of the cleavage guide grooves 252 is 125 µm. On the other hand, the cleavage assist grooves 254 has a depth d5 of 20 µm and a line width w of 20 µm, and are arranged with a pitch p of 500 µm between themselves in the <1-100> direction.

For a maximum bar yield rate in the dicing of the wafer, each stroke of the cleavage guide grooves 252 is formed, preferably, in the shape of a solid line as long as possible in the <11-20> direction within the region described above, but may be formed in the shape of a broken line. The cleavage guide grooves 252 may be formed, instead of by scribing as described above, by dry etching such as RIE or wet etching.

Next, the wafer, having the cleavage guide grooves 252 formed in this way, is cleaved in the <11-20> direction into bars. The dicing of the wafer here is achieved by pressing a breaking blade onto the cleavage assist grooves 254 from below the bottom surface of the GaN-based substrate 250, in the positions where the cleavage guide grooves 252 are located, from below so as to break the wafer. In this way, in the bars cleaved apart, end surfaces are formed by exploiting cleaved surfaces at which the stripe-shaped waveguides 253 are split. The dicing of the wafer may be achieved by cleaving, i.e., hitting the wafer with a blade so that it is broken by the shock, or by heating the portions around the scribed lines locally, or by breaking using the shock caused by a sound wave or a stream of water or the like.

By cleaving in this way a wafer as shown in FIGS. 11A and 11B, we obtained a large number of bars with a cavity length of 500 µm. The actually measured cavity lengths were within ±5 µm of the design value of 500 µm, and the bar yield rate was over 96%. Moreover, in the bars thus cleaved apart, we measured the average of the surface irregularities on the end surfaces between the cleavage guide grooves 252 and obtained results comparable to those obtained in the first embodiment. This attests to an improvement in quality in terms of the flatness of the cleaved end surfaces compared with a case where a GaN-based semiconductor is laid on a sapphire substrate.

The bars thus obtained by cleaving a wafer as shown in FIGS. 11A and 11B are then further cleaved, by performing scribing in their bottom or top surface in the <1-100> direction between every two adjacent stripe-shaped waveguides 253, into individual GaN-based semiconductor laser devices. Here, the scribing may be performed with such a stylus force as to press the bars and thereby brake them in the <1-100> direction into GaN-based semiconductor laser devices, or may be performed in such a way as to completely cut the bars into GaN-based semiconductor laser devices.

2. Structure of the GaN-Based Semiconductor Laser Device

With reference to FIG. 12, the structure of the semiconductor laser device Ia formed by being diced apart from a wafer as described above will be described. In the semiconductor laser device 1a shown in FIG. 12, such elements as are found also in the GaN-based semiconductor laser device 1 shown in FIG. 4 are identified with the same reference numerals, and their detailed explanations will not be repeated.

In the GaN-based semiconductor laser device 1a fabricated by the fabrication method of this embodiment, as in the first embodiment, in the four corners in its top surface, on its LD structure 11 side, cutaway portions 14 are formed, which correspond to the cleavage guide grooves 252 (FIGS. 11A and 11B). Moreover, in the bottom surface of the GaN-based substrate 10, in two places on the mirror end surface side, cutaway portions 15 are formed. These cutaway portions 15 correspond to the cleavage assist grooves 254 (FIGS. 11A and 11B) that have been formed in the bottom surface of the wafer beforehand.

Although the GaN-based semiconductor laser device Ia has four cutaway portions 14 in this embodiment, the number of cutaway portions 14 formed in practice may vary, starting from at least one, depending on how the cleavage guide grooves 252 are formed in the top surface of the wafer beforehand. Likewise, although two cutaway portions 15 are formed in this embodiment, the number of cutaway portions 15 formed in practice may vary, starting from at least one, depending on how the cleavage assist grooves 254 are formed in the bottom surface of the wafer beforehand.

In this embodiment, when the wafer is diced to form the GaN-based semiconductor laser device, the cutaway portions that are formed as remnants of the cleavage guide grooves may be cut off altogether. This has the advantage of removing the dust or the like produced when the cleavage guide grooves are formed.

In this embodiment, a wafer having a structure similar to that of the first embodiment is diced into individual GaN-based semiconductor laser devices by forming cleavage guide grooves and cleavage assist grooves in the top and bottom surfaces, respectively, of the wafer. Instead, it is also possible to dice a wafer having a structure similar to that of the second embodiment (FIG. 5) into individual GaN-based semiconductor laser devices by forming cleavage guide grooves and cleavage assist grooves in the top and bottom surfaces, respectively, of the wafer.

In all the embodiments described above, a particular plane is selected as the direction in which to form mirror end surfaces. However, it is also possible to select instead a plane parallel to any of the {0001}, {11-20}, and {1-100} planes, which are cleavage planes inherent in a GaN-based semiconductor having a hexagonal crystal structure. Of these planes, the {1-100} plane is preferred because it shows good cleavage. Specifically, it is preferable to form mirror end surfaces on one of the (1-100), (10-10), (01-10), (-1100), (-1010), and (0-110) planes.

It is to be understood that the present invention applies not only to semiconductor laser devices having optical waveguide structures as specifically described in the embodiments above. That is, the present invention applies not only to the ridge structure dealt with in the embodiments above but also to other structures such as the self-aligned structure (SAS), electrode stripe structure, embedded hetero structure (BH), and channeled substrate planar (CSP) structure to achieve the same effects as described above without affecting the substance of the invention.

According to the present invention, cleavage guide grooves are formed in a direction of cleavage near optical waveguides so that individual nitride semiconductor devices are obtained by being diced apart through cleavage occurring along those cleavage guide grooves. This makes it possible to reduce the surface roughness on end surfaces near the optical waveguides of the nitride semiconductor devices and thereby obtain mirror surfaces. This helps improve the FFP of the emitted light and reduce the rate of defects, permitting nitride semiconductor devices to be fabricated with a yield rate of 90% or higher.

What is claimed is:

1. A method of fabricating a nitride semiconductor device, comprising:
   forming a nitride semiconductor wafer by depositing on a substrate that exhibits cleavage a nitride semiconductor layer comprising a compound containing a group III element and nitrogen and having a cleavage plane crystallographically similar to a cleavage plane of the substrate and comprising a plurality of stripe-shaped optical waveguides formed at an equal separation in the nitride semiconductor layer;
   adjusting a thickness of the nitride semiconductor wafer so that the thickness falls within a range from 80 to 160 µm;
   forming a plurality of cleavage guide grooves in a shape of discontinuous broken lines in a top surface of the nitride semiconductor wafer by scribing from above the nitride semiconductor layer so that the cleavage guide grooves reach the substrate and no cleavage guide groove extends over the stripe-shaped optical wave guides; and
   cleaving the nitride semiconductor wafer along the cleavage guide grooves.

2. The method of fabricating a nitride semiconductor device of claim 1, wherein the substrate comprises a nitride semiconductor substrate comprising another compound containing a group III element and nitrogen.

3. The method of fabricating a nitride semiconductor device of claim 1, wherein the forming of the cleavage guide grooves is such that the cleavage guide grooves are discontinuous in a same broken line with an equal interval of 1 mm or shorter.

4. The method of fabricating a nitride semiconductor device of claim 1, wherein at least one cleavage guide groove is formed between any two neighboring stripe-shaped optical waveguides along a same broken line of the cleavage guide grooves.

5. The method of fabricating a nitride semiconductor device of claim 1, wherein a distance from the top surface of the nitride semiconductor wafer to bottoms of the cleavage guide grooves is equal to or larger than 1 µm and equal to or smaller than 10 µm.

6. The method of fabricating a nitride semiconductor device of claim 1, further comprising forming a plurality of cleavage assist grooves in a shape of discontinuous broken lines in the top surface of the nitride semiconductor wafer so as to reach half a thickness of the nitride semiconductor layer by scribing from above the top surface of the nitride semiconductor layer, wherein the cleavage guide grooves are formed by scribing from bottom surfaces of the cleavage assist grooves.

7. The method of fabricating a nitride semiconductor device of claim 1, further comprising forming cleavage assist grooves in a bottom surface of the nitride semiconductor wafer by scribing from below the nitride semiconductor substrate so that the cleavage guide grooves are located along center axes of the cleavage assist grooves, prior to the cleaving of the nitride semiconductor wafer.

8. The method of fabricating a nitride semiconductor device of claim 5, wherein the forming of the cleavage guide grooves is such that the cleavage guide grooves are discontinuous in a same broken line with an equal interval of 1 mm or shorter.

9. The method of fabricating a nitride semiconductor device of claim 6, wherein a distance from the top surface of the nitride semiconductor wafer to a deepest end of the cleavage guide grooves is equal to or larger than 1 µm and equal to or smaller than 10 µm.

10. The method of fabricating a nitride semiconductor device of claim 9, wherein the forming of the cleavage guide grooves is such that the cleavage guide grooves are discontinuous in a same broken line with an equal interval of 1 mm or shorter.

11. The method of fabricating a nitride semiconductor device of claim 7, wherein the substrate comprises a nitride semiconductor substrate comprising another compound containing a group III element and nitrogen.

12. The method of fabricating a nitride semiconductor device of claim 7, wherein a distance from the top surface of the nitride semiconductor wafer to a deepest end of the cleavage guide grooves is equal to or larger than 1 µm and equal to or smaller than 10 µm.

13. The method of fabricating a nitride semiconductor device of claim 7, further comprising forming a plurality of cleavage assist grooves in a shape of discontinuous broken lines in the top surface of the nitride semiconductor wafer so as to reach half a thickness of the nitride semiconductor layer by scribing from above the top surface of the nitride semiconductor layer, wherein the cleavage guide grooves are formed by scribing from bottom surfaces of the cleavage assist grooves.

14. The method of fabricating a nitride semiconductor device of claim 12, wherein the forming of the cleavage guide grooves is such that the cleavage guide grooves are discontinuous in a same broken line with an equal interval of 1 mm or shorter.

15. The method of fabricating a nitride semiconductor device of claim 13, wherein a distance from the top surface of the nitride semiconductor wafer to a deepest end of the cleavage guide grooves is equal to or larger than 1 µm and equal to or smaller than 10 µm.

16. The method of fabricating a nitride semiconductor device of claim 15, wherein the forming of the cleavage guide grooves is such that the cleavage guide grooves are discontinuous in a same broken line with an equal interval of 1 mm or shorter.

17. A method of fabricating a nitride semiconductor device, comprising:

forming a nitride semiconductor wafer by depositing on a substrate that exhibits cleavage a nitride semiconductor layer comprising a compound containing a group III element and nitrogen and having a cleavage plane crystallographically similar to a cleavage plane of the substrate and comprising a plurality of stripe-shaped optical waveguides formed at an equal separation in the nitride semiconductor layer;

adjusting a thickness of the nitride semiconductor wafer so that the thickness falls within a range from 80 to 160 µm;

forming a plurality of cleavage guide grooves in a shape of discontinuous broken lines in a bottom surface of the nitride semiconductor wafer by scribing from below the substrate so that no cleavage guide groove extends under the stripe-shaped optical wave guides; and cleaving the nitride semiconductor wafer along the cleavage guide grooves.

18. The method of fabricating a nitride semiconductor device of claim 17, wherein the substrate comprises a nitride semiconductor substrate of comprising another compound containing a group III element and nitrogen.

19. The method of fabricating a nitride semiconductor device of claim 17, wherein the forming of the cleavage guide grooves is such that the cleavage guide grooves are discontinuous in a same broken line with an equal interval of 1 mm or shorter.

* * * * *